(12) United States Patent
Stoeckl et al.

(10) Patent No.: US 12,057,411 B2
(45) Date of Patent: Aug. 6, 2024

(54) STRESS RELIEF DIE IMPLEMENTATION

(71) Applicant: Intel Corporation, Santa Clara, CA (US)

(72) Inventors: Stephan Stoeckl, Schwandorf (DE); Wolfgang Molzer, Ottobrunn (DE); Georg Seidemann, Landshut (DE); Bernd Waidhas, Pettendorf (DE)

(73) Assignee: Intel Corporation, Santa Clara, CA (US)

( * ) Notice: Subject to any disclaimer, the term of this patent is extended or adjusted under 35 U.S.C. 154(b) by 855 days.

(21) Appl. No.: 16/721,095

(22) Filed: Dec. 19, 2019

(65) Prior Publication Data

US 2021/0193594 A1 Jun. 24, 2021

(51) Int. Cl.
| | | |
|---|---|---|
| *H01L 23/58* | (2006.01) | |
| *H01L 21/56* | (2006.01) | |
| *H01L 21/683* | (2006.01) | |
| *H01L 23/31* | (2006.01) | |
| *H01L 49/02* | (2006.01) | |
| *H01L 23/00* | (2006.01) | |

(52) U.S. Cl.
CPC .......... *H01L 23/585* (2013.01); *H01L 21/565* (2013.01); *H01L 21/568* (2013.01); *H01L 21/6835* (2013.01); *H01L 23/3114* (2013.01); *H01L 23/3128* (2013.01); *H01L 28/40* (2013.01); *H01L 24/13* (2013.01); *H01L 2221/68359* (2013.01); *H01L 2221/68368* (2013.01); *H01L 2224/0231* (2013.01); *H01L 2224/02373* (2013.01); *H01L 2224/13024* (2013.01)

(58) Field of Classification Search
CPC ... H01L 23/585; H01L 21/565; H01L 21/568; H01L 21/6835; H01L 23/3114; H01L 23/3128; H01L 28/40; H01L 24/13; H01L 2221/68359; H01L 2221/68368; H01L 2224/0231; H01L 2224/02373; H01L 2224/13024; H01L 2224/16225; H01L 23/562; H01L 23/58
USPC ........................................................ 257/773
See application file for complete search history.

(56) References Cited

U.S. PATENT DOCUMENTS

| | | | |
|---|---|---|---|
| 6,292,352 B1* | 9/2001 | Yamamichi | H01L 28/60 257/295 |
| 8,461,691 B2* | 6/2013 | Meyer | H01L 24/96 257/773 |
| 8,580,683 B2* | 11/2013 | Wang | H01L 25/0655 257/782 |
| 8,610,286 B2* | 12/2013 | Lin | H01L 23/3135 257/774 |
| 9,111,950 B2* | 8/2015 | Sun | H01L 33/54 |

(Continued)

*Primary Examiner* — Vu A Vu
(74) *Attorney, Agent, or Firm* — Schwabe, Williamson & Wyatt P.C.

(57) ABSTRACT

Embodiments disclosed herein include semiconductor packages. In a particular embodiment, the semiconductor package is a wafer level chip scale package (WLCSP). In an embodiment, the WLCSP comprises a die. In an embodiment, the die comprises an active surface and a backside surface. The die has a first coefficient of thermal expansion (CTE). In an embodiment, the WLCSP further comprises a channel into the die. In an embodiment, the channel is filled with a stress relief material, where the stress relief material has a second CTE that is greater than the first CTE.

25 Claims, 15 Drawing Sheets

(56) References Cited

U.S. PATENT DOCUMENTS

| | | | | |
|---|---|---|---|---|
| 9,318,404 B2* | 4/2016 | Lin | ........................ | H01L 24/96 |
| 9,446,941 B2* | 9/2016 | Jiang | .................... | B81B 7/0048 |
| 9,548,273 B2* | 1/2017 | Gao | ................... | H01L 21/6835 |
| 9,786,593 B1* | 10/2017 | Lin | ................... | H01L 21/76898 |
| 2014/0035935 A1* | 2/2014 | Shenoy | ................... | H01L 23/15 |
| | | | | 174/257 |

* cited by examiner

STRESS RELIEF DIE IMPLEMENTATION

TECHNICAL FIELD

Embodiments of the present disclosure relate to semiconductor devices, and more particularly wafer level chip scale packages (WLCSPs) with improved thermal cycling behavior.

BACKGROUND

With increasing die size of wafer level chip scale packages (WLCSPs), the mechanical robustness decreases. Particularly, the temperature cycling on board (TCoB) performance decreases, especially in the package corner due to the high thermal mismatch between the die and the board. Several solutions have been proposed to mitigate the stress attributable to the mismatch in coefficient of thermal expansion (CTE) between the components.

One solution is to use an underfill material around the interconnects between the WLCSP and the board. However, the inclusion of a package underfill requires additional processing steps and, therefore, increases costs. An additional solution is to increase the stand-off height of the interconnects. Such solutions result in an increase in the z-height of the package, which is not desirable in many applications. Yet another solution is to increase the size of the solder resist opening. Increasing the size of the opening reduces the ability to provide narrow and compact routing and, therefore, results in an increase in the package footprint.

EMBODIMENTS OF THE PRESENT DISCLOSURE

Described herein are wafer level chip scale packages (WLCSPs) with improved thermal cycling behavior, in accordance with various embodiments. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

As noted above, there is a thermal mismatch between the die of the WLCSP and the board. Typically, the coefficient of thermal expansion (CTE) of the die is between 2-3 ppm and the CTE of the board is between 12-16 ppm. This CTE mismatch between the board and the WLCSP results in poor temperature cycling on board (TCoB) performance. As the footprint of the WLCSP increases, the stresses due to the thermal mismatch are amplified. This leads to reliability issues, particularly at the package corners. Accordingly, embodiments disclosed herein include a stress relief feature in the die of the WLCSP. The stress relief feature has a CTE that is greater than the CTE of the die. Accordingly, the effective CTE of the die is increased to more closely match the CTE of the board. More closely matching the CTE between the die and the board reduces the stress induced in the interconnects and, therefore, improves reliability.

Figure 1A:
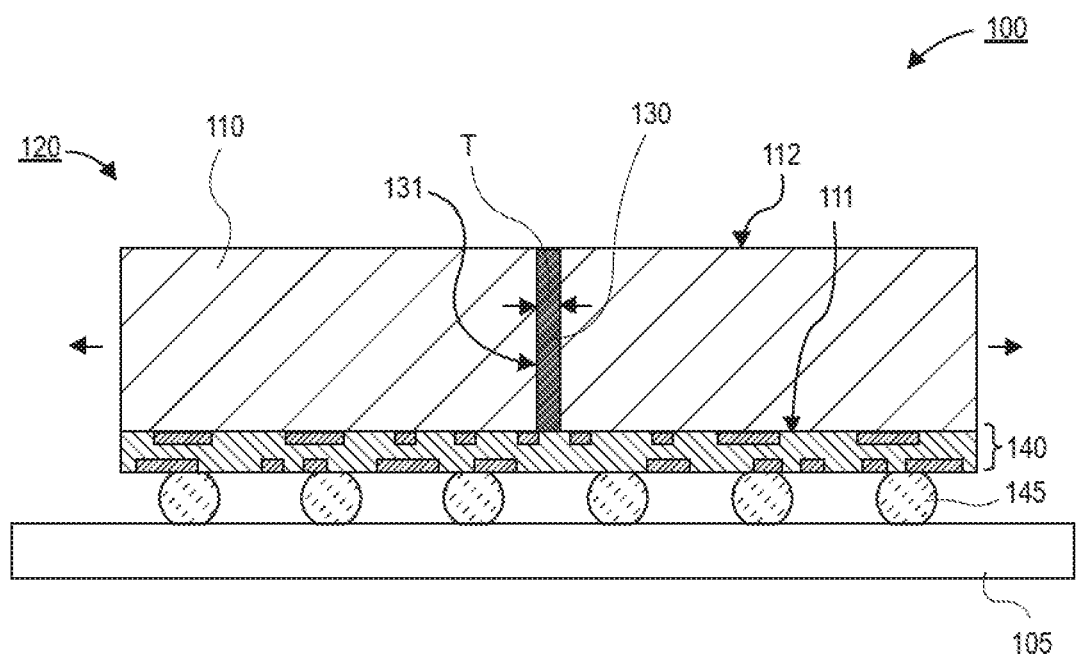
FIG. 1A is a cross-sectional illustration of a WLCSP that comprises a stress relief channel that passes through a thickness of the die, in accordance with an embodiment.

Referring now to FIG. 1A, a cross-sectional illustration of an electronic system 100 is shown, in accordance with an embodiment. In an embodiment, the electronic system comprises a board 105 and a WLCSP 120. The board 105 may be any suitable board. For example, the board 105 may be a printed circuit board or the like. In an embodiment, the board 105 is electrically coupled to the WLCSP 120 by interconnects 145. As shown, the interconnects 145 are solder balls, however, it is to be appreciated that any interconnect architecture may be used.

In an embodiment, the WLCSP 120 may comprise a die 110 and a redistribution layer (RDL) 140 over the die 110. The die 110 may comprise an active surface 111 and a backside surface 112. The active surface 111 may comprise integrated circuitry, transistors, and the like (not shown). The active surface 111 may also comprise back end of line (BEOL) layers (not shown). The RDL 140 is disposed over the active surface 111 of the die 110. The RDL 140 may comprise conductive routing (e.g., traces, pads, vias, etc.) that electrically couples the integrated circuitry of the active surface 111 to the interconnects 145. In an embodiment, the die 110 may be any type of die. For example, the die 110 may be a processor die, a graphics processor die, a memory die or the like. In an embodiment, the die 110 comprises silicon and/or any other suitable semiconductor materials.

In an embodiment, the WLCSP 120 may further comprise a stress relief channel 131. In an embodiment, the stress relief channel 131 may pass through a thickness of the die 110. That is, the stress relief channel 131 may pass from the active surface 111 to the backside surface 112 of the die 110. In the illustrated embodiment, the stress relief channel 131 includes substantially vertical sidewalls. Such an embodiment may be provided by a mechanical sawing process or the like. Additional embodiments may include a stress relief channel 131 with tapered sidewalls that are typical of a laser drilling process.

In an embodiment, the stress relief channel 131 is filled with a stress relief material 130. The stress relief material 130 comprises a CTE that is greater than a CTE of the die 110. Accordingly, the effective CTE of the WLCSP 120 is increased in order to more closely match the CTE of the board 105. Particularly, the effective CTE in the horizontal direction is increased. That is, the increase in the effective CTE allows for the die 110 to expand more laterally as indicated by the arrows extending out from the sidewalls. In an embodiment, the stress relief material 130 may comprise a conductive material. For example, the stress relief material 130 may include copper, silver, or the like.

In an embodiment, the stress relief material 130 is electrically isolated from the circuitry of the active surface 111 and the RDL 140. This is in contrast to a through substrate via (TSV) that would typically be electrically connected to the active surface 111 and/or the RDL 140. In other embodiments, the stress relief material 130 may be electrically coupled to one or both of the active surface 111 and/or the RDL 140. Such an embodiment is described in greater detail below with respect to FIG. 3.

In an embodiment, the increase in the effective CTE is dependent on the thickness T of the stress relief channel 131 and the material chosen for the stress relief material 130. For example, as the thickness T increases, the effective CTE is increased. In an embodiment, the thickness T may be approximately 10 μm or greater. In a particular embodiment, the thickness T may be between approximately 30 μm and approximately 50 μm.

Figure 1B:
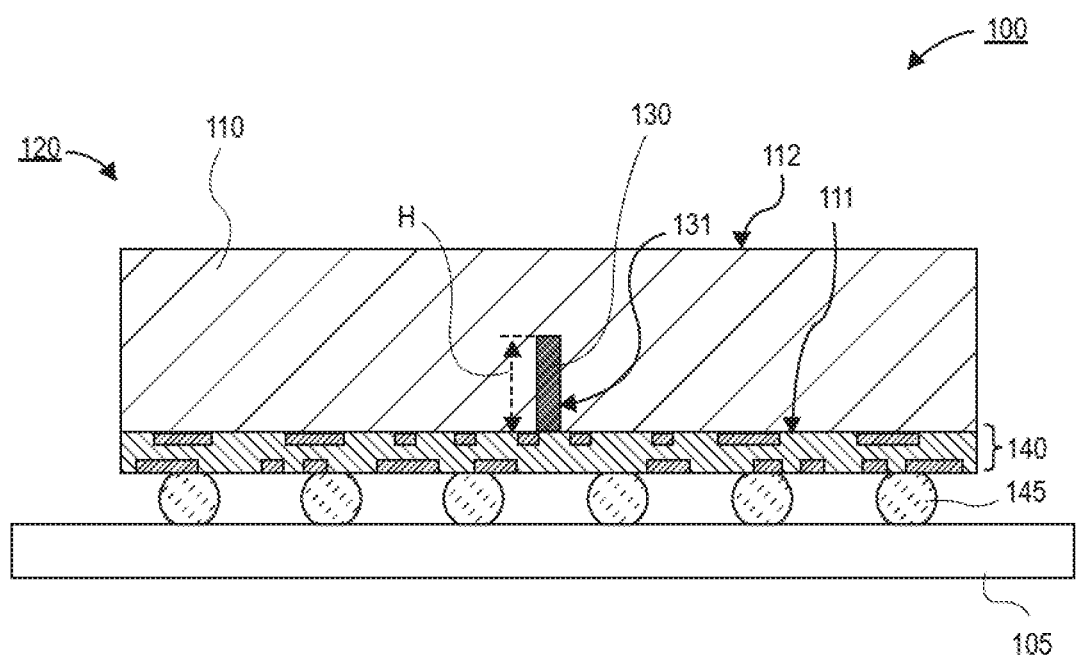
FIG. 1B is a cross-sectional illustration of a WLCSP that comprises a stress relief channel that is formed into the active surface of the die, in accordance with an embodiment.

Referring now to FIG. 1B, a cross-sectional illustration of an electronic system 100 is shown, in accordance with an additional embodiment. In an embodiment, the electronic system 100 may be substantially similar to the electronic system 100 in FIG. 1A, with the exception that the stress relief channel 131 does not pass entirely through a thickness of the die 110 of the WLCSP 120. In an embodiment, the stress relief channel 131 is formed into the active surface 111 of the die 110, but does not pass through to the backside surface 112 of the die. In an embodiment, the channel 131 may have a height H. The height H may be any value less than the total thickness of the die 110. Embodiments with a stress relief channel 131 that does not pass entirely through a thickness of the die 110 may provide improved mechanical reliability since the die 110 is not completely diced and the left side of the die 110 remains monolithically attached to the right side of the die 110.

Figure 1C:
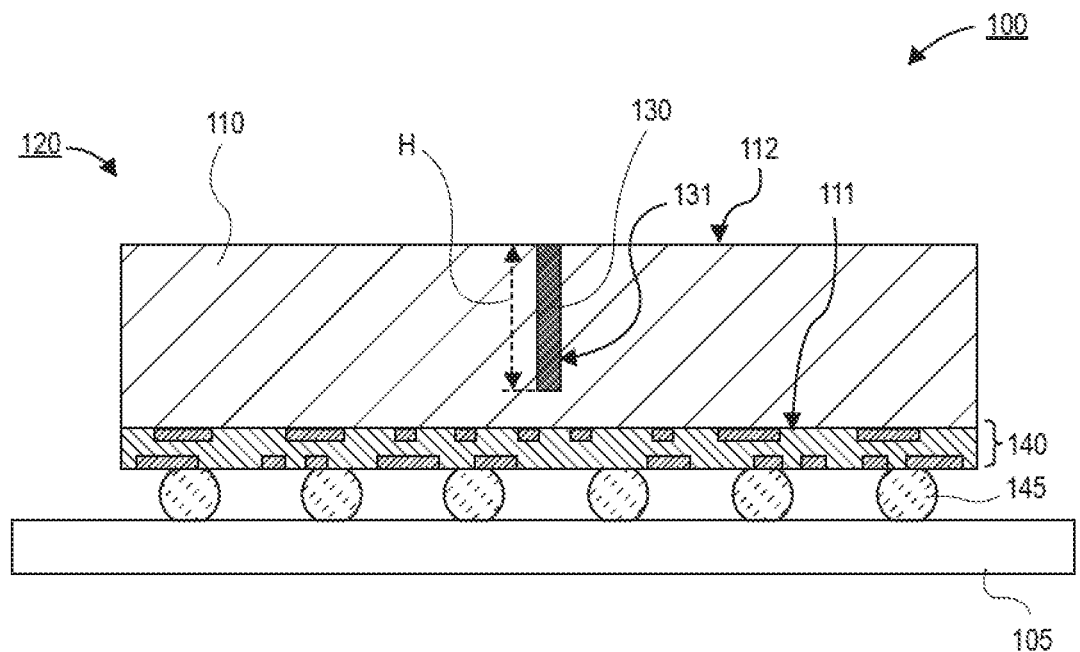
FIG. 1C is a cross-sectional illustration of a WLCSP that comprises a stress relief channel that is formed into a backside surface of the die, in accordance with an embodiment.

Referring now to FIG. 1C, a cross-sectional illustration of an electronic system 100 is shown, in accordance with an embodiment. In an embodiment, the electronic system 100 may be substantially similar to the electronic system 100 in FIG. 1B, with the exception that the stress relief channel 131 is formed into the backside surface 112 of the die 110. Forming the stress relief channel 131 into the backside surface 112 of the die 110 is beneficial because it doesn't occupy any area on the active surface 111 of the die 110.

Figure 1D:
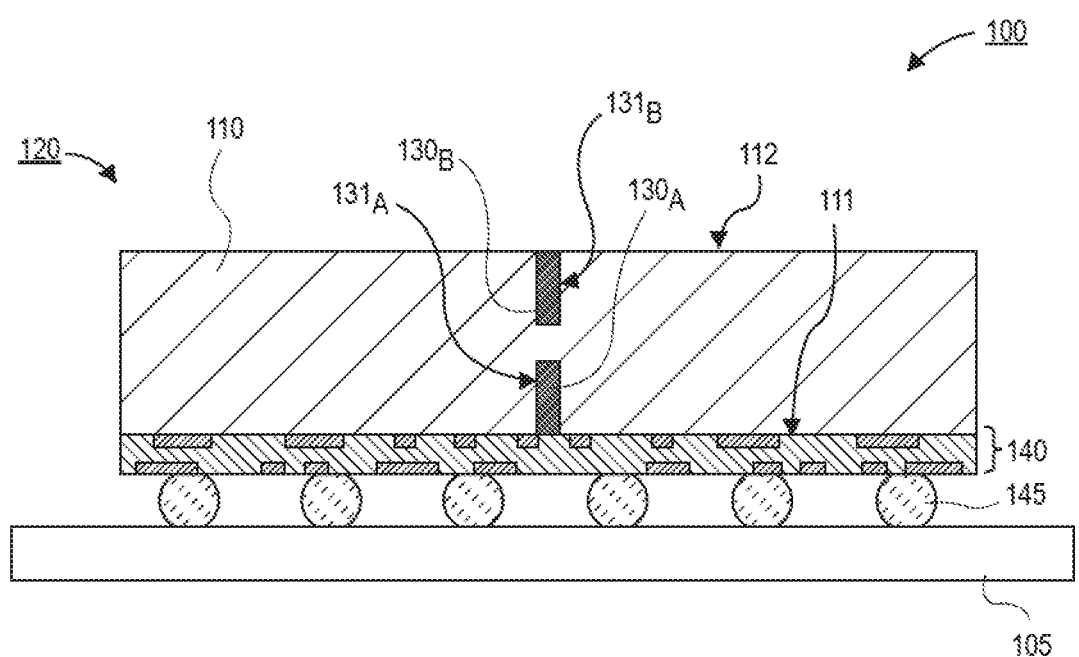
FIG. 1D is a cross-sectional illustration of a WLCSP that comprises a first stress relief channel and a second stress relief channel, in accordance with an embodiment.

Referring now to FIG. 1D, a cross-sectional illustration of an electronic system 100 is shown, in accordance with an embodiment. In an embodiment, the electronic system 100 may be substantially similar to the electronic system 100 in FIG. 1B, with the exception that a pair of stress relief channels 131A and 131B are formed into the die 110. In an embodiment, the first stress relief channel 131A is formed into the active surface 111 and the second stress relief channel 131B is formed into the backside surface 112 of the die 110. In an embodiment, the first stress relief channel 131A is aligned with the second stress relief channel 131B. In other embodiments, the first stress relief channel 131A and the second stress relief channel 131B may be offset from each other. In the illustrated embodiment, the first stress relief material 130A and the second stress relief material 130B are shown as being the same material. In other embodiments, the first stress relief material 130A and the second stress relief material 130B may be different materials.

Figure 1E:
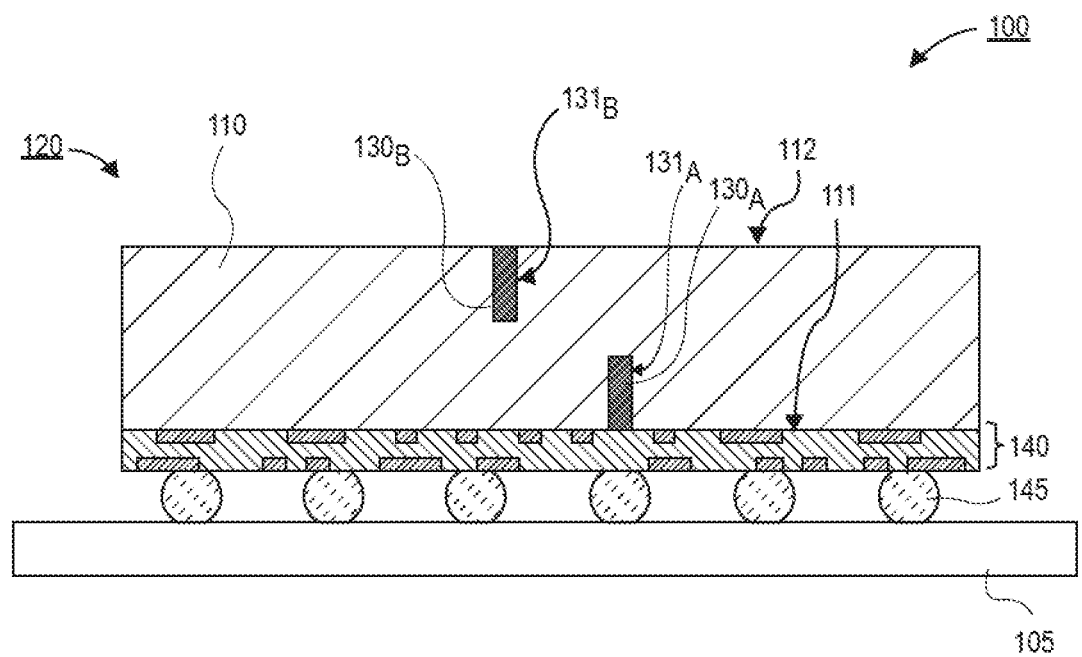
FIG. 1E is a cross-sectional illustration of a WLCSP that comprises a first stress relief channel and a second stress relief channel where the two channels are offset from each other, in accordance with an embodiment.

Referring now to FIG. 1E, a cross-sectional illustration of an electronic system 100 is shown, in accordance with an embodiment. The electronic system 100 in FIG. 1E may be substantially similar to the electronic system 100 in FIG. 1D, with the exception that the pair of stress relief channels 131A and 131B are offset from each other. That is, the pair of stress relief channels 131A and 131B may not be aligned with each other in some embodiments.

Figure 2A:
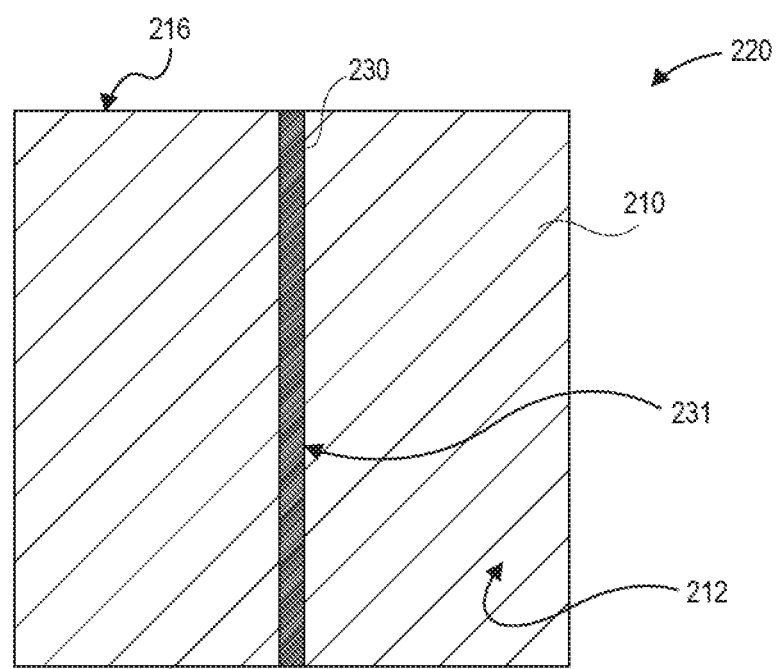
FIG. 2A is a plan view illustration of a WLCSP that comprises a stress relief channel that extends from a first sidewall of the die to a second sidewall of the die, in accordance with an embodiment.

Referring now to FIG. 2A, a plan view illustration of a WLCSP 220 is shown, in accordance with an embodiment. In an embodiment, the WLCSP 220 may comprise a die 210 and a stress relief channel 231 filled with a stress relief material 230. In an embodiment, the stress relief channel 231 extends across an entire width of the die 210. Particularly, the stress relief channel 231 may extend from a first edge 216 to a second edge 217 that is opposite from the first edge 216.

In FIG. 2A, the plan view illustration depicts a backside surface 212 of the die 210. The stress relief channel 231 may pass entirely through a thickness of the die 210 (similar to the embodiment shown in FIG. 1A) or the stress relief channel 231 may pass partially through the die 210 (similar to the embodiments shown in FIG. 1C and FIG. 1D). Additionally, similar layouts (in the x-y plane) may be implemented with a stress relief channel 231 that is formed into the active surface (not shown) (similar to the embodiment shown in FIG. 1B).

Figure 2B:
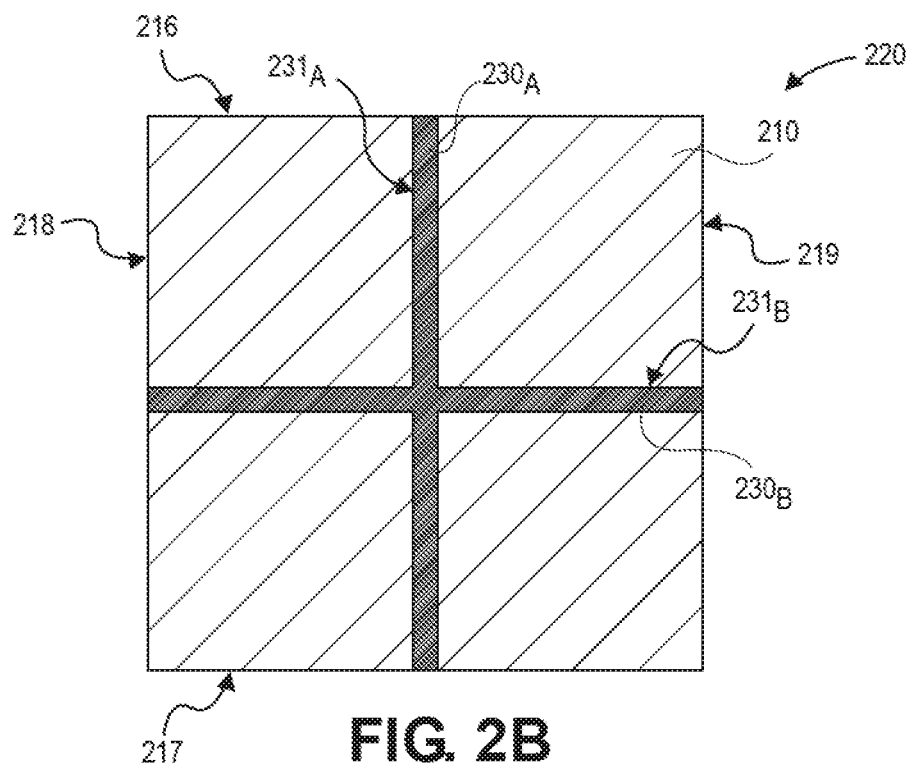
FIG. 2B is a plan view illustration of a WLCSP that comprises a first stress relief channel and a second stress relief channel that intersects the first stress relief channel, in accordance with an embodiment.

Referring now to FIG. 2B, a plan view illustration of a WLCSP 220 is shown, in accordance with an additional embodiment. In an embodiment, the WLCSP 220 includes a first stress relief channel 231A and a second stress relief channel 231B. The first stress relief channel 231A may extend from a first edge 216 to a second edge 217, and the second stress relief channel 231B may extend from a third edge 218 to a fourth edge 219.

Figure 2C:
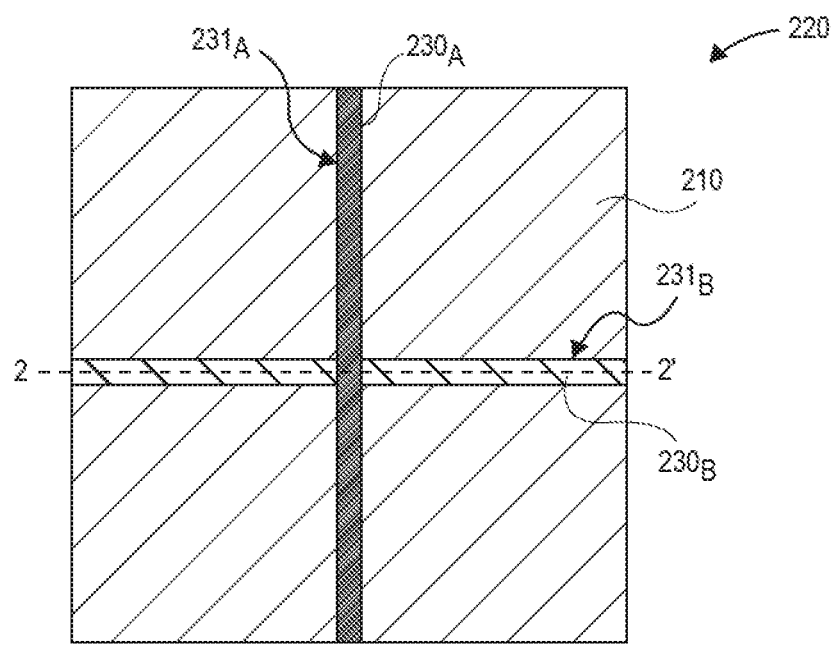
FIG. 2C is a plan view illustration of a WLCSP that comprises a first stress relief channel and second stress relief channel, where the first channel and the second channel are filled with different materials, in accordance with an embodiment.

In an embodiment, the second stress relief channel 231B may intersect the first stress relief channel 231A. For example, the second stress relief channel 231B may be substantially orthogonal to the first stress relief channel 231A. Providing stress relief channels 231A and 231B at orthogonal angles with respect to each other provides a modified CTE in both the x-direction (i.e., between edge 218 and edge 219) and the y-direction (i.e., between edge 216 and edge 217). In an embodiment, the first stress relief channel 231A is filled with a first stress relief material 230A and the second stress relief channel 231B is filled with a second stress relief material 230B. In an embodiment, the first stress relief material 230A is the same as the second stress relief material 230B. In other embodiments, the first stress relief material 230A is different than the second stress relief material 230B, as shown in FIG. 2C.

Figure 2D:
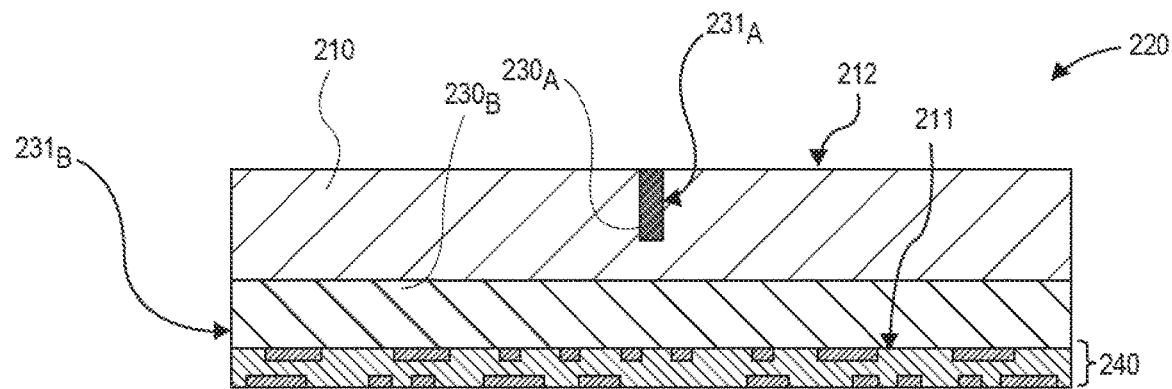
FIG. 2D is a cross-sectional illustration of the WLCSP in FIG. 2C where the first stress relief channel and the second stress relief channel are formed into opposite surfaces of the die and do not intersect with each other, in accordance with an embodiment.
Figure 2E:
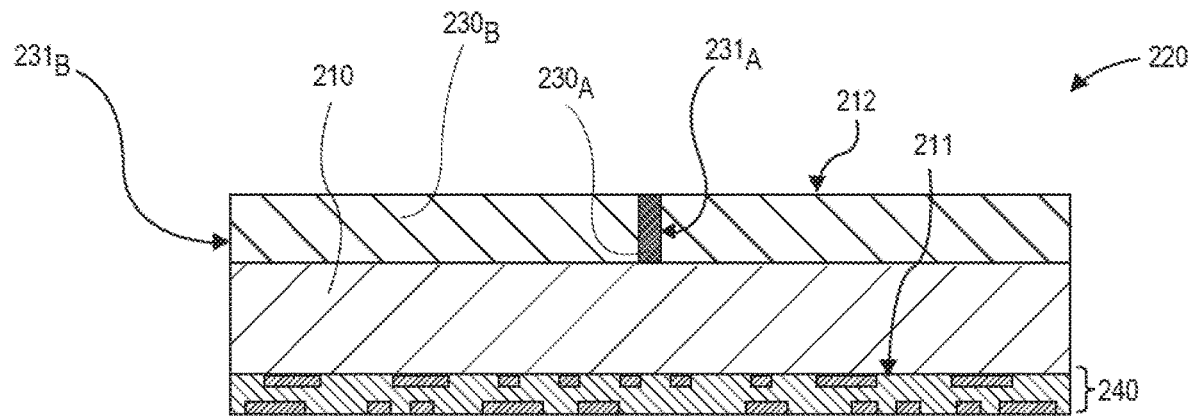
FIG. 2E is a cross-sectional illustration of a WLCSP where the first stress relief channel and the second stress relief channel intersect, in accordance with an embodiment.

Referring now to FIGS. 2D and 2E, cross-sectional illustrations of a WLCSP 220 are shown, in accordance with various embodiments. The cross-sectional illustrations are along lines 2-2' of FIG. 2C and illustrate variations in the locations of the first stress relief channel 231A and the second stress relief channel 231B. In FIGS. 2D and 2E, the first stress relief material 230A and the second stress relief material 230B are shown as different materials. However, in some embodiments, the first stress relief material 230A and the second stress relief material 230B may be the same material.

As shown in FIG. 2D, the first stress relief channel 231A is formed into the backside surface 212 of the die 210 and the second stress relief channel 231B is formed into the active surface 211 of the die 210 over the redistribution layer 240. That is, the first stress relief channel 231A and the second stress relief channel 231B may be oriented in different directions without intersecting each other in some embodiments.

As shown in FIG. 2E, the first stress relief channel 231A and the second stress relief channel 231B are formed into the backside surface 212 of the die 210. That is, the first stress relief channel 231A and the second stress relief channel 231B may intersect each other in some embodiments. In the illustrated embodiment, the depth of the first stress relief channel 231A substantially matches a depth of the second stress relief channel 231B. However, it is to be appreciated that the depths of the first stress relief channel 231A and the second stress relief channel 231B may differ from each other in some embodiments.

Figure 2F:
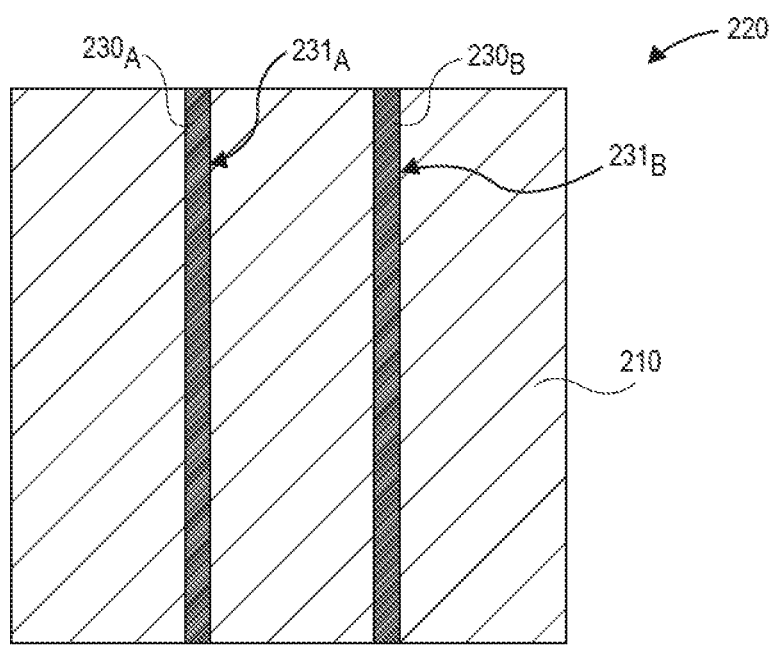
FIG. 2F is a plan view illustration of a WLCSP that comprises a first stress relief channel and a second stress relief channel, where the two channels are parallel to each other, in accordance with an embodiment.
Figure 2G:
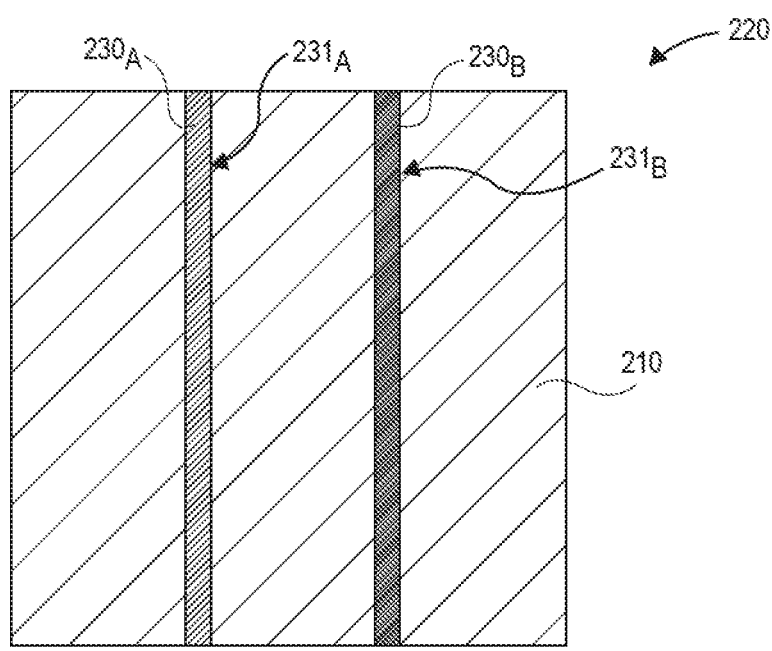
FIG. 2G is a plan view illustration of a WLCSP that comprises a first stress relief channel with a first stress relief material and a second stress relief channel with a second stress relief material, in accordance with an embodiment.
Figure 2H:
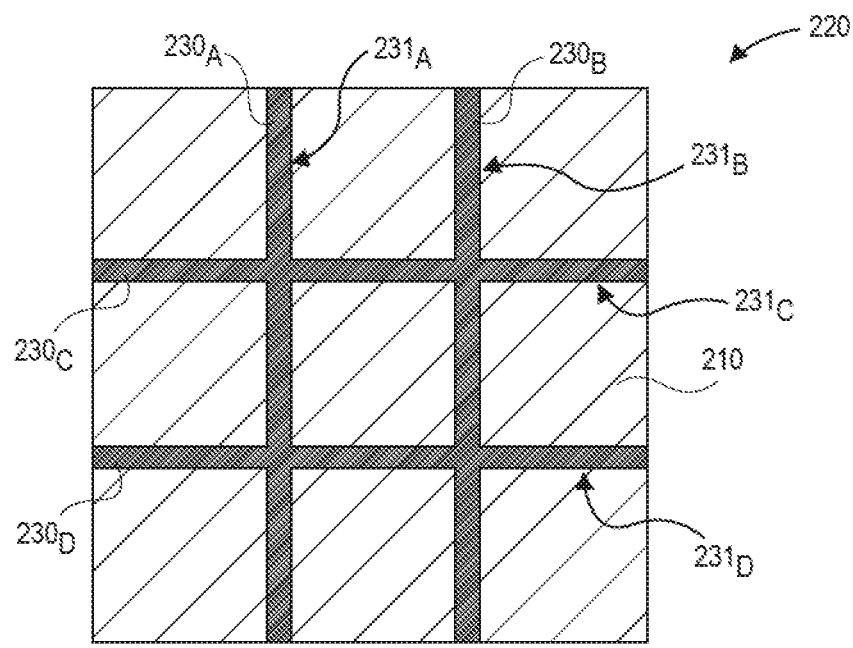
FIG. 2H is a plan view illustration of a WLCSP that comprises a plurality of stress relief channels, in accordance with an embodiment.

Referring now to FIG. 2F, a plan view illustration of a WLCSP 220 is shown, in accordance with an additional embodiment. In an embodiment, the WLCSP 220 may comprise a first stress relief channel 231A and a second stress relief channel 231B. The first stress relief channel 231A may be substantially parallel to the second stress relief channel 231B. Providing a plurality of parallel stress relief channels 231A and 231B allows for the effective CTE to be increased without requiring a single wide stress relief channel 231 that may disrupt placement of integrated circuitry of the die 210. As shown in FIG. 2G, the first stress relief material 230A may be different than the second stress relief material 230B Referring now to FIG. 2H, a plan view illustration of a WLCSP 220 is shown, in accordance with an additional embodiment. The WLCSP 220 may comprise a plurality of stress relief channels 231A-D. For example, stress relief channels 231A and 231B may extend in a first direction, and stress relief channels 231C and 231D may extend in a second direction that is orthogonal to the first direction. In the illustrated embodiment, all of the stress relief materials 230A-D are the same material. In other embodiments, two or more different materials may be used for the stress relief materials 230A-D.

In addition to providing a modified CTE, the stress relief materials 230A-D may also provide electrical shielding within the die 210 when the stress relief materials 230A-D are conductive materials. Electrical shielding may be beneficial in situations where the die 210 includes a plurality of cores or other discrete processing blocks. In such instances, the stress relief materials 230A-D may minimize or prevent cross-talk between regions of the die 210.

Figure 3:
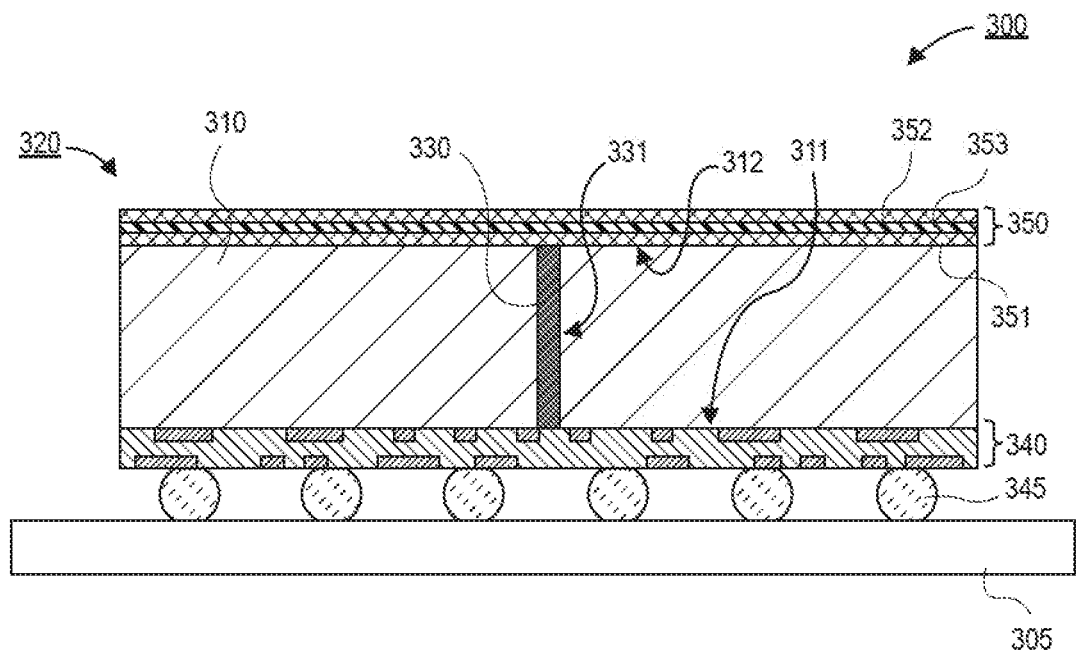
FIG. 3 is a cross-sectional illustration of a WLCSP that comprises a component over the backside surface of the die, where the stress relief channel electrically couples the component to the active surface of the die, in accordance with an embodiment.

Referring now to FIG. 3, a cross-sectional illustration of an electronic system 300 is shown, in accordance with an embodiment. In an embodiment, the electronic system 300 comprises a board 305 and a WLCSP 320. The board is electrically coupled to the WLCSP 320 by interconnects 345. In an embodiment, the WLCSP 320 comprises a die 310 and an RDL 340 over the active surface 311 of the die 310. The WLCSP 320 may also comprise a stress relief channel 331 that extends from the active surface 311 to the backside surface 312. In an embodiment, an additional component 350 is disposed over a backside surface 312 of the die 310. The additional component 350 may be electrically coupled to the active surface 311 and/or the RDL 340 by the stress relief material 330 in the stress relief channel 331. In an embodiment, the additional component 350 may be an active or passive component. For example, the component 350 in FIG. 3 is a capacitor that comprises a first electrode 351, a dielectric layer 353, and a second electrode 352.

Referring now to FIGS. 4A-4F, a series of cross-sectional illustrations depicting a process for forming a WLCSP is shown, in accordance with an embodiment.

Figure 4A:
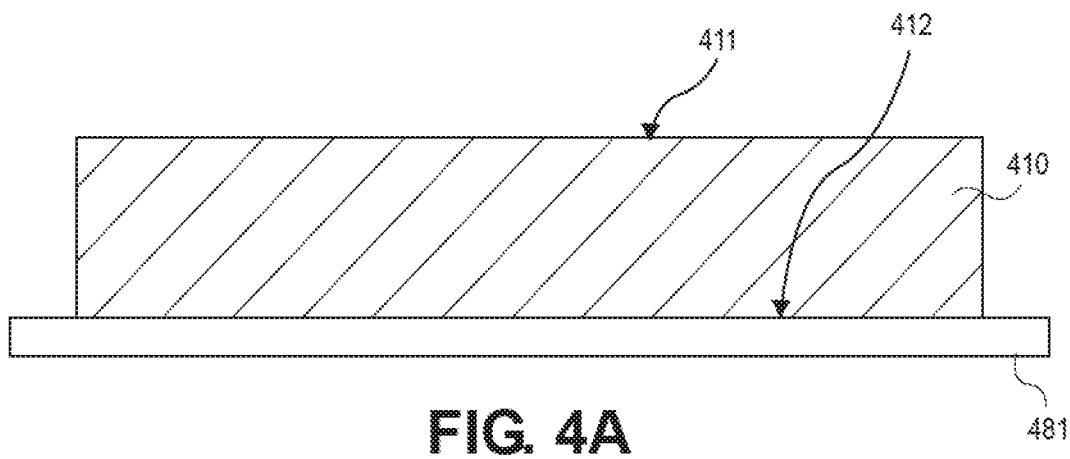
FIG. 4A is a cross-sectional illustration of a die on a carrier, in accordance with an embodiment.

Referring now to FIG. 4A, a cross-sectional illustration of a die 410 on a carrier 481 is shown, in accordance with an embodiment. In an embodiment, the die 410 may be secured to the carrier by an adhesive or the like (not shown). A backside surface 412 of the die 410 faces the carrier 481, and an active surface 411 of the die 410 faces away from the carrier 481.

Figure 4B:
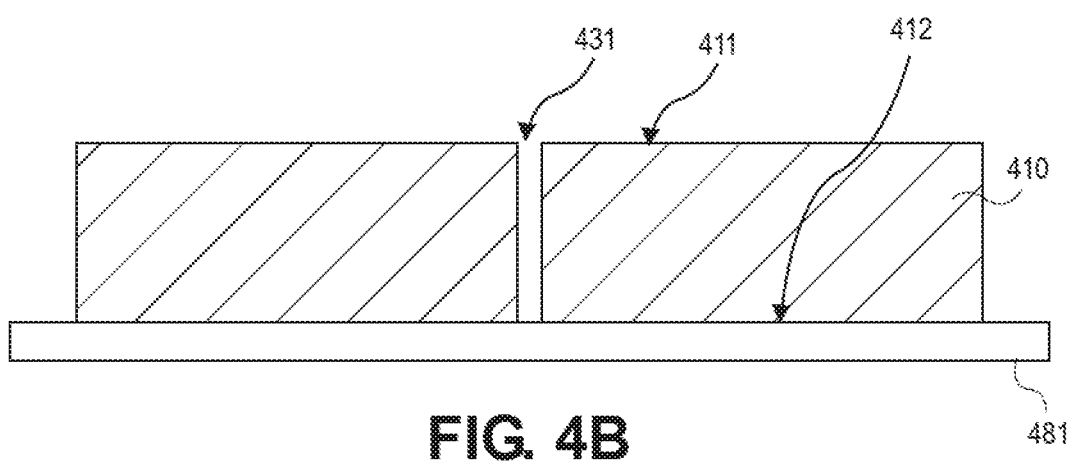
FIG. 4B is a cross-sectional illustration of the die after a stress relief channel is formed into the die, in accordance with an embodiment.

Referring now to FIG. 4B, a cross-sectional illustration of the die 410 after a stress relief channel 431 is formed into the die 410 is shown, in accordance with an embodiment. In an embodiment, the stress relief channel 431 may be formed with a mechanical sawing process, a laser drilling process, or the like. The stress relief channel 431 may be formed into the active surface 411 and pass all the way through the die 410 to the backside surface 412. However, in some embodiments, the stress relief channel 431 may only pass partially through the thickness of the die 410.

Figure 4C:
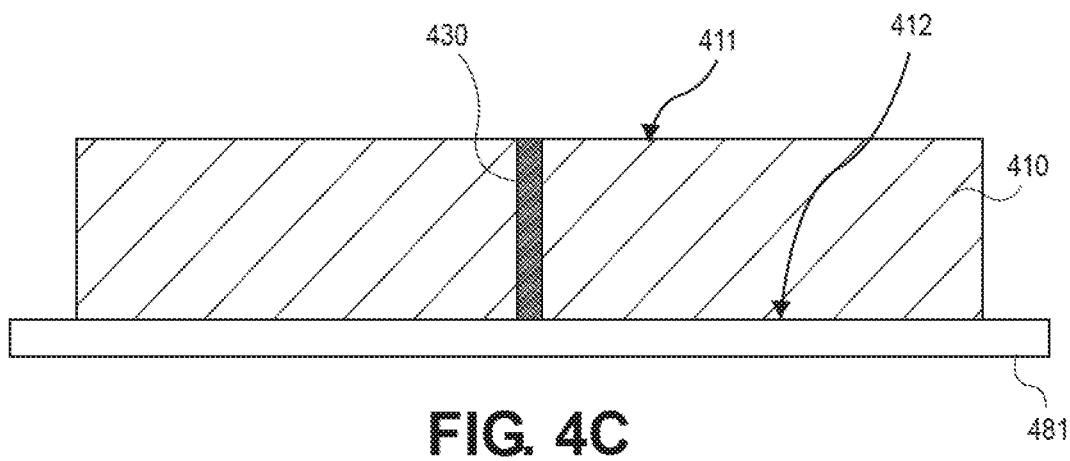
FIG. 4C is a cross-sectional illustration of the die after a stress relief material is disposed into the channel, in accordance with an embodiment.

Referring now to FIG. 4C, a cross-sectional illustration of the die 410 after a stress relief material 430 is disposed into the stress relief channel 431 is shown, in accordance with an embodiment. In an embodiment, the stress relief material 430 is a material that has a CTE that is higher than a CTE of the die 410. In some embodiments, the stress relief material 430 is a conductive material, such as copper. The stress relief material 430 may be deposited with any suitable process, such as plating, sputtering, or the like. Any overburden of the stress relief material 430 over the active surface 411 may be removed (e.g., with an etching process, a polishing process, or the like).

Figure 4D:
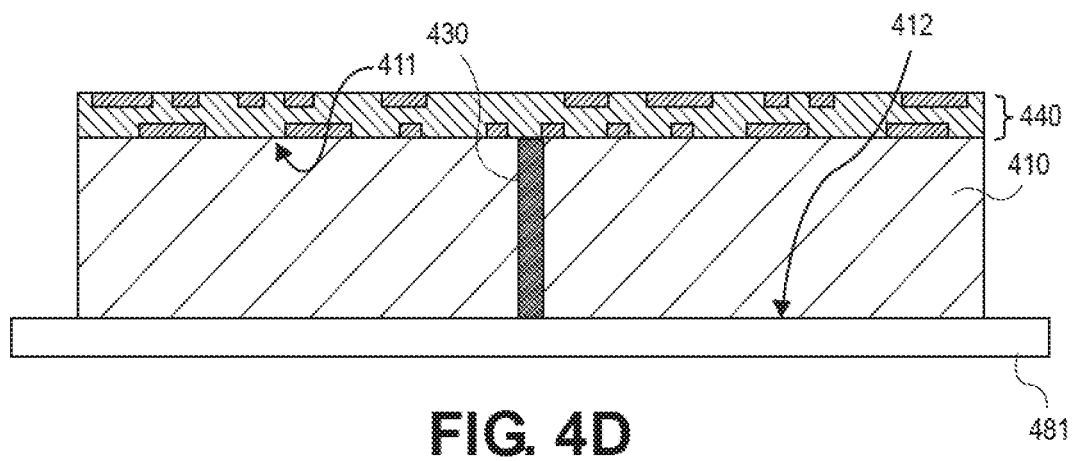
FIG. 4D is a cross-sectional illustration of the die after a redistribution layer (RDL) is disposed over the die, in accordance with an embodiment.

Referring now to FIG. 4D, a cross-sectional illustration of the die 410 after an RDL 440 is disposed over the active surface 411 is shown, in accordance with an embodiment. In an embodiment, the RDL 440 may comprise any number of layers to provide the needed routing for the WLCSP. For example, two metal layers are shown in FIG. 4D, but embodiments may include a single metal layer or more than one metal layer.

Figure 4E:
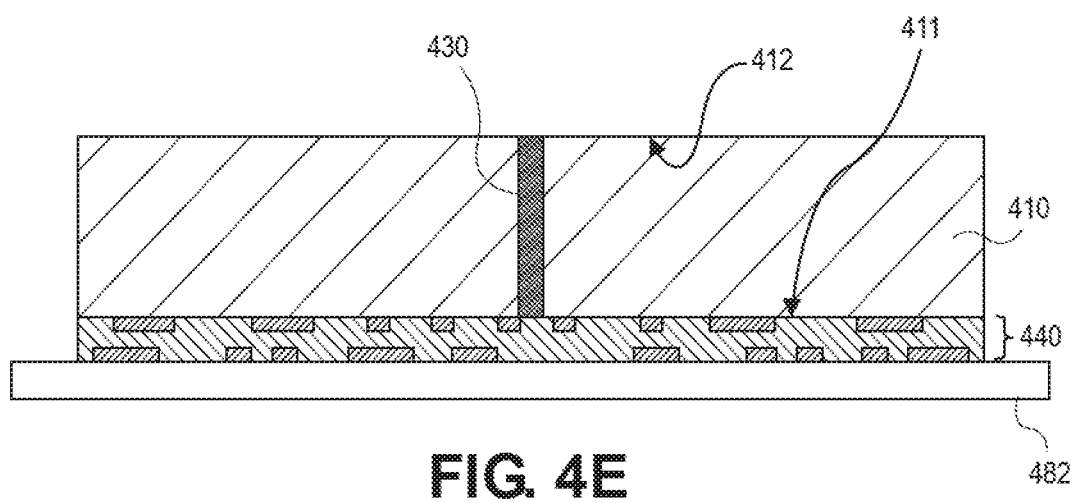
FIG. 4E is a cross-sectional illustration of the die after the carrier is removed, in accordance with an embodiment.

Referring now to FIG. 4E, a cross-sectional illustration of the die 410 after the carrier 481 is removed is shown, in accordance with an embodiment. The carrier 481 may be removed with any suitable process, and any residual adhesive on the die 410 may be cleared. Accordingly, the backside surface 412 of the die 410 is exposed. In an embodiment, the RDL 440 may be attached to a second carrier 482.

Figure 4F:
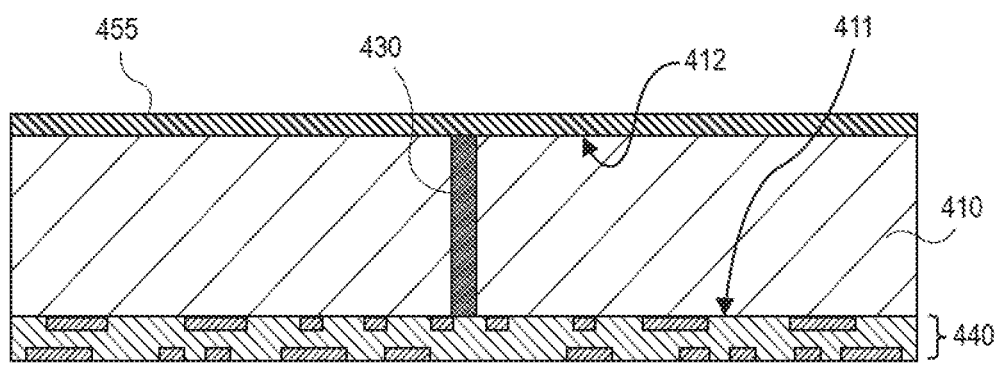
FIG. 4F is a cross-sectional illustration of the die after a protection layer is disposed over a backside surface of the die, in accordance with an embodiment.

Referring now to FIG. 4F, a cross-sectional illustration of the die 410 after a backside protection layer 455 is disposed over the die 410 is shown, in accordance with an embodiment. In an embodiment, the backside protection layer 455 is disposed over the exposed backside surface 412 using any suitable deposition process. The backside protection layer 455 may be a polymer or other molding compound. In an embodiment, the second carrier 482 may be removed with any suitable process, and any residual adhesive on the RDL 440 may be removed.

Referring now to FIGS. 5A-5E, a series of cross-sectional illustrations depicting a process for forming a molded WLCSP is shown, in accordance with an embodiment.

Figure 5A:
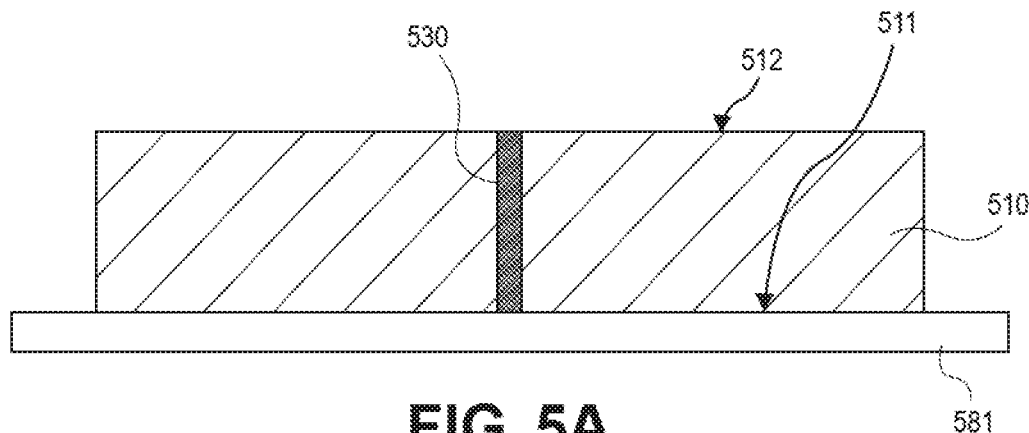
FIG. 5A is a cross-sectional illustration of a die with a stress relief channel over a carrier, in accordance with an embodiment.

Referring now to FIG. 5A, a cross-sectional illustration of a die 510 on a first carrier 581 is shown, in accordance with an embodiment. The die 510 may include an active surface 511 that is facing the carrier 581 and a backside surface 512 that is facing away from the carrier 581. A stress relief material 530 may fill a channel through the die 510. The channel and the stress relief material 530 may be formed through the die 510 in substantially the same manner as shown in FIGS. 4A-4C, except that the die 510 is flipped upside down compared to the die 410.

Figure 5B:
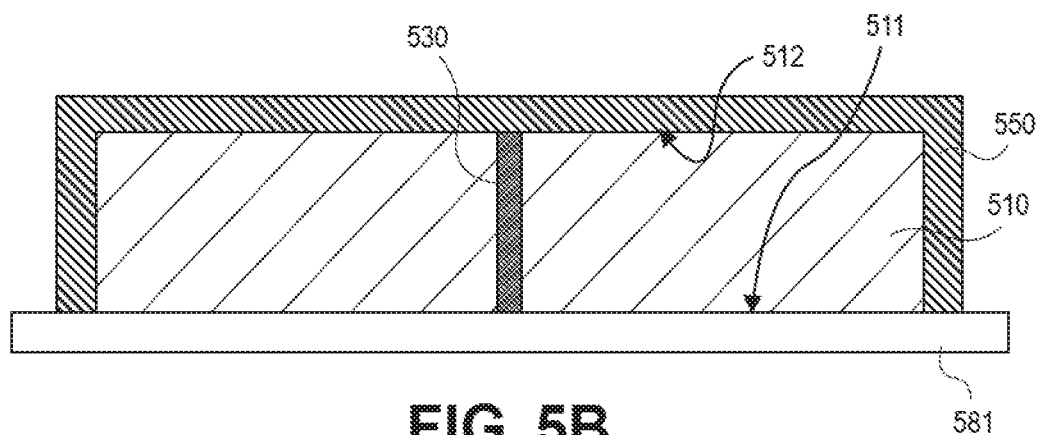
FIG. 5B is a cross-sectional illustration of the die after a mold layer is disposed over the die, in accordance with an embodiment.

Referring now to FIG. 5B, a cross-sectional illustration of the die 510 after a mold layer 550 is disposed over the die 510 is shown, in accordance with an embodiment. The mold layer 550 may be disposed over and in contact with the sidewall surfaces of the die 510 and the backside surface 512 of the die 510. In an embodiment, the mold layer 550 may also contact a portion of the stress relief material 530.

Figure 5C:
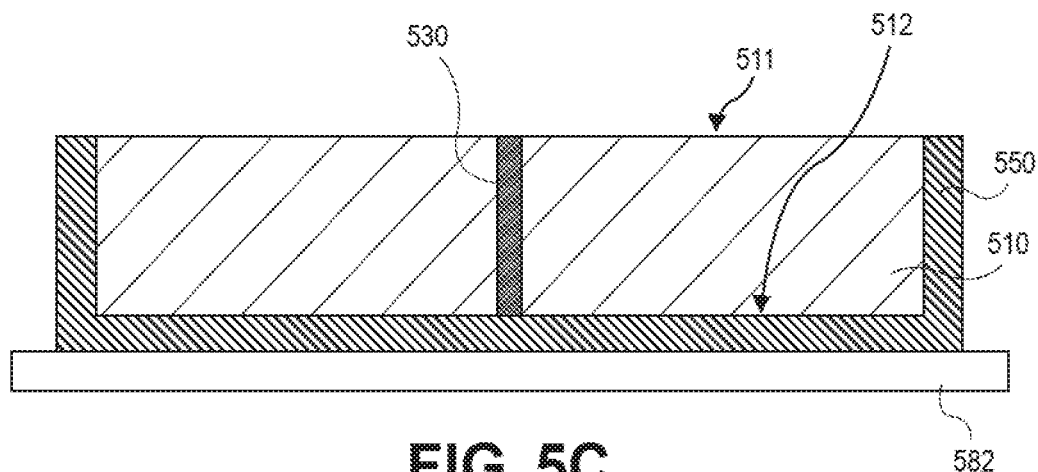
FIG. 5C is a cross-sectional illustration of the die after the die is transferred to a second carrier, in accordance with an embodiment.

Referring now to FIG. 5C, a cross-sectional illustration of the die 510 after the die is transferred from the first carrier 581 to a second carrier 582 is shown, in accordance with an embodiment. In an embodiment, the die 510 is secured to the second carrier 582 so that the active surface 511 faces away from the second carrier 582.

Figure 5D:
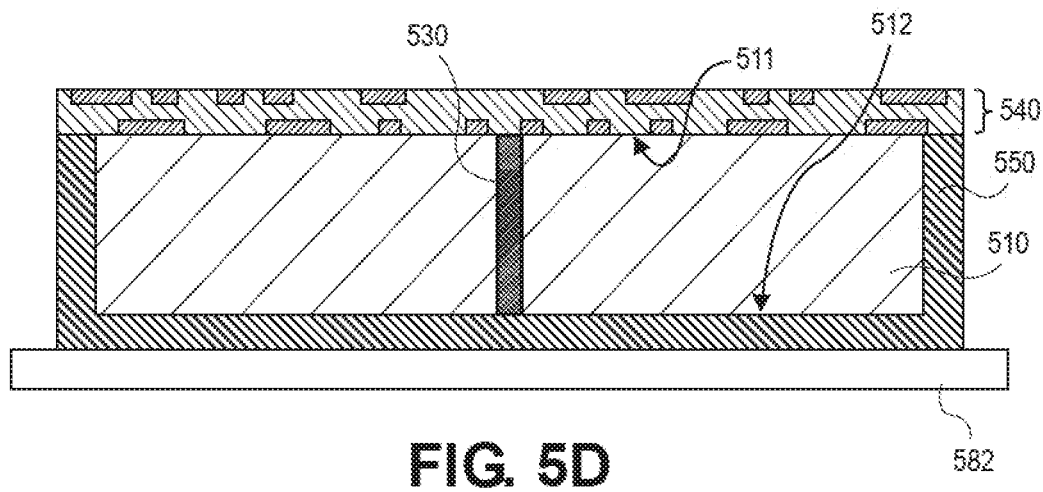
FIG. 5D is a cross-sectional illustration of the die after an RDL is disposed over the die, in accordance with an embodiment.

Referring now to FIG. 5D, a cross-sectional illustration of the die 510 after an RDL 540 is disposed over the active surface 511 of the die 510 is shown, in accordance with an embodiment. In an embodiment, the RDL 540 may comprise any number of layers to provide the needed routing for the WLCSP. For example, two metal layers are shown in FIG. 5D, but embodiments may include a single metal layer or more than one metal layer. In an embodiment, the RDL 540 may extend past the sidewalls of the die 510. That is, the RDL 540 may contact the active surface 511 of the die 510 and a portion of the mold layer 550.

Figure 5E:
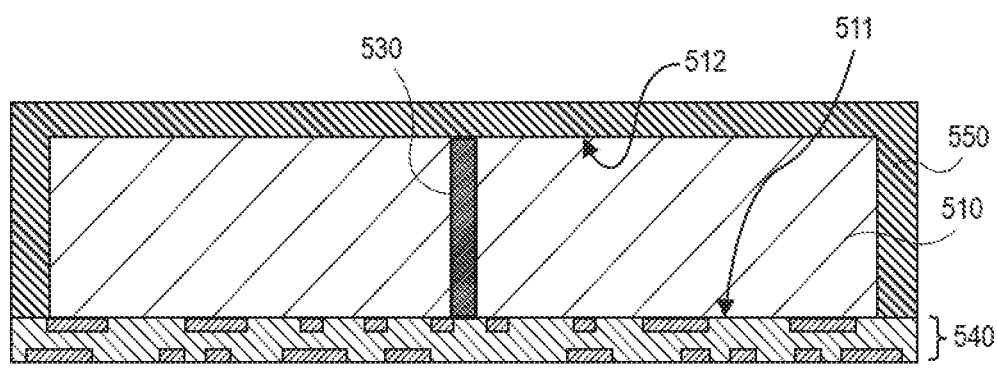
FIG. 5E is a cross-sectional illustration of the die after the second carrier is removed, in accordance with an embodiment.

Referring now to FIG. 5E, a cross-sectional illustration of the die 510 after the second carrier 582 is removed is shown, in accordance with an embodiment. The second carrier 582 may be removed with any suitable process, and any residual adhesive may be cleared from the mold layer 550 in some embodiments.

In addition to providing a modified CTE, the stress relief materials 530 may also provide electrical shielding within the die 510 when the stress relief materials 530 are conductive. Electrical shielding may be beneficial in situations where the die 510 includes a plurality of cores or other discrete processing blocks. In such instances, the stress relief material 530 may minimize or prevent cross-talk between regions of the die 510. In some embodiments, the stress relief materials 530 may also be electrically coupled to external shielding over the package.

Referring now to FIGS. 6A-6F, a series of cross-sectional illustrations depicting a process for forming a WLCSP with a backside stress relief channel is shown, in accordance with an embodiment.

Figure 6A:
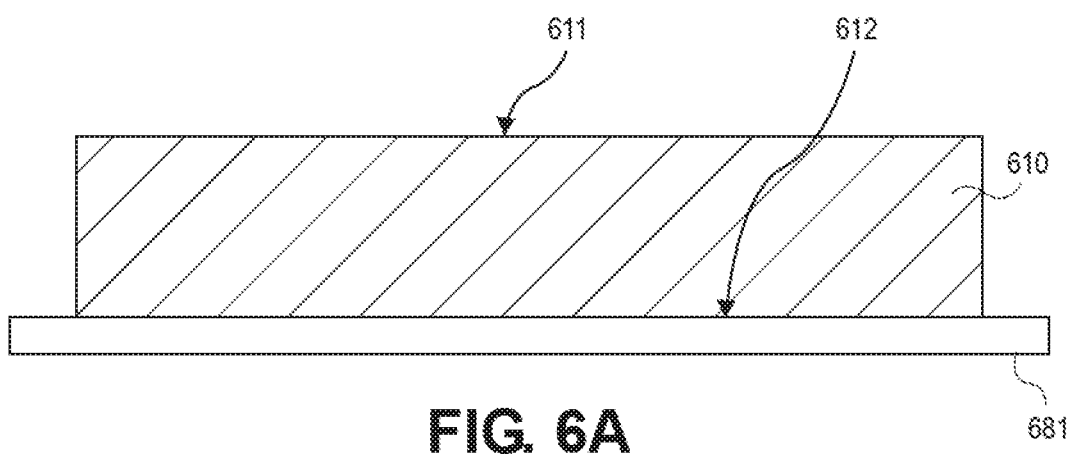
FIG. 6A is a cross-sectional illustration of a die attached to a carrier, in accordance with an embodiment.

Referring now to FIG. 6A, a cross-sectional illustration of a die 610 on a first carrier 681 is shown, in accordance with an embodiment. In an embodiment, the die 610 may be secured to the carrier by an adhesive or the like (not shown). A backside surface 612 of the die 610 faces the first carrier 681, and an active surface 611 of the die 610 faces away from the first carrier 681.

Figure 6B:
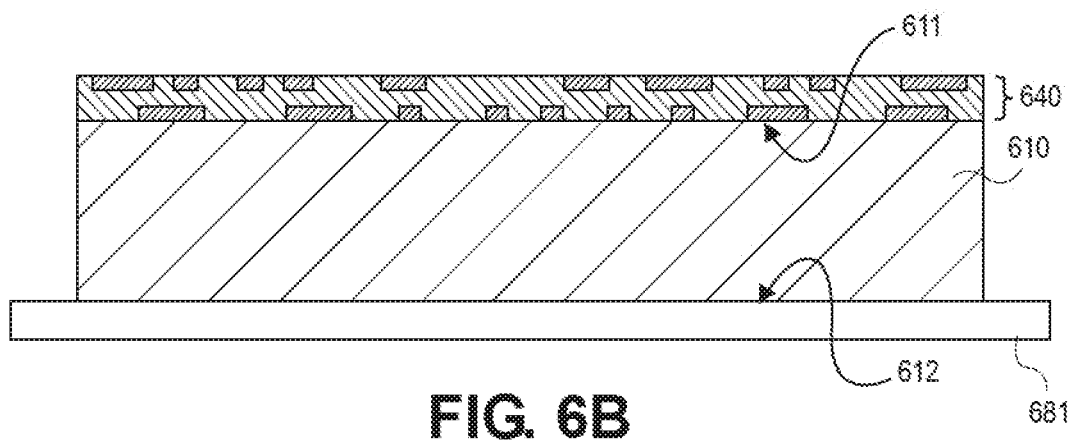
FIG. 6B is a cross-sectional illustration of the die after an RDL is disposed over the die, in accordance with an embodiment.

Referring now to FIG. 6B, a cross-sectional illustration of the die 610 after an RDL 640 is disposed over the die 610 is shown, in accordance with an embodiment. In an embodiment, the RDL 640 is disposed over the active surface 611 of the die 610. In an embodiment, the RDL 640 may comprise any number of layers to provide the needed routing for the WLCSP. For example, two metal layers are shown in FIG. 6B, but embodiments may include a single metal layer or more than one metal layer.

Figure 6C:
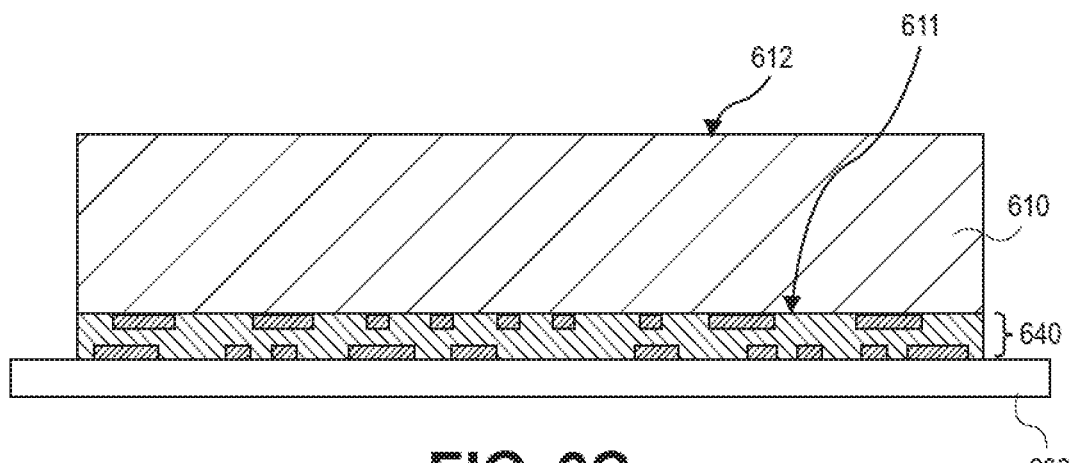
FIG. 6C is a cross-sectional illustration of the die after the die is transferred to a second carrier, in accordance with an embodiment.

Referring now to FIG. 6C, a cross-sectional illustration of the die 610 after the die 610 is transferred from the first carrier 681 to a second carrier 682 is shown, in accordance with an embodiment. In an embodiment, the die 610 is secured to the second carrier 682 so that the backside surface 612 is exposed.

Figure 6D:
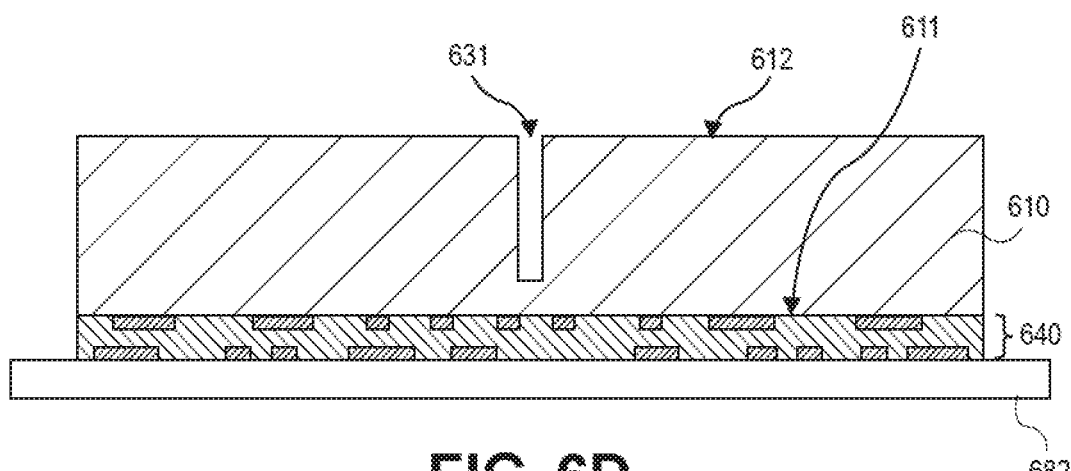
FIG. 6D is a cross-sectional illustration of the die after a stress relief channel is formed into the die, in accordance with an embodiment.

Referring now to FIG. 6D, a cross-sectional illustration of the die 610 after a stress relief channel 631 is formed into the backside surface 612 of the die is shown, in accordance with an embodiment. In an embodiment, the stress relief channel 631 may be formed with a mechanical sawing process, a laser drilling process, or the like. In the illustrated embodiment, the stress relief channel 631 does not pass through an entire thickness of the die 610. However, in other embodiments, the stress relief channel 631 may pass from the backside surface 612 to the active surface 611.

Figure 6E:
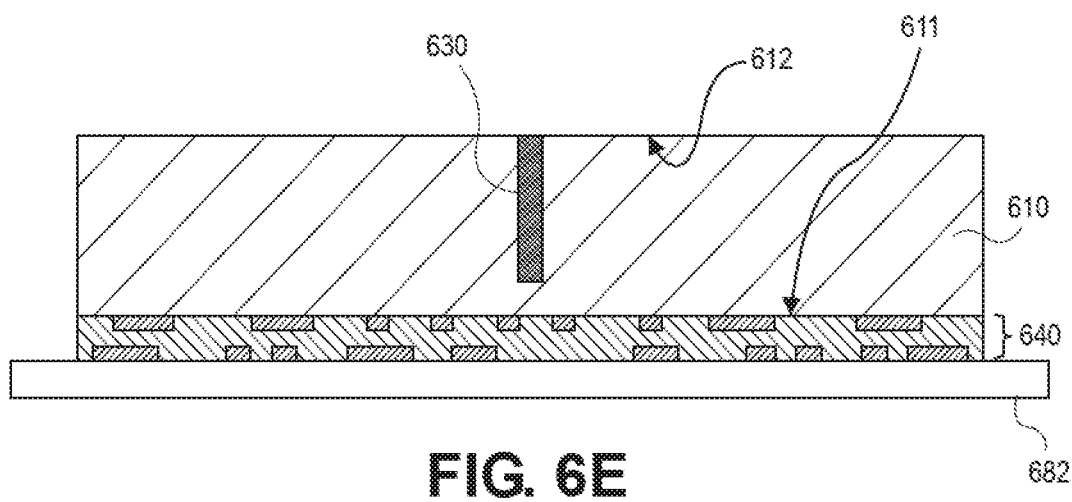
FIG. 6E is a cross-sectional illustration of the die after a stress relief material is disposed into the channel, in accordance with an embodiment.

Referring now to FIG. 6E, a cross-sectional illustration of the die 610 after a stress relief material 630 is disposed into the stress relief channel 631 is shown, in accordance with an embodiment. In an embodiment, the stress relief material 630 is a material that has a CTE that is higher than a CTE of the die 610. In some embodiments, the stress relief material 630 is a conductive material, such as copper. The stress relief material 630 may be deposited with any suitable process, such as plating, sputtering, or the like. Any overburden of the stress relief material 630 over the active surface 611 may be removed (e.g., with an etching process, a polishing process, or the like).

Figure 6F:
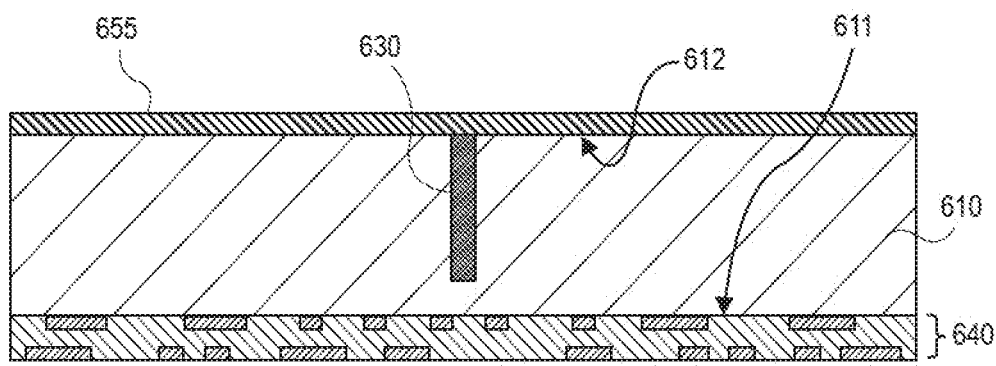
FIG. 6F is a cross-sectional illustration of the die after a backside protection layer is disposed over the die and the second carrier is removed, in accordance with an embodiment.

Referring now to FIG. 6F, a cross-sectional illustration of the die 610 after the die 610 is removed from the second carrier 682 and a backside protection layer 655 is disposed over the backside surface 612 is shown, in accordance with an embodiment. The second carrier 682 may be removed with any suitable process, and any residual adhesive on the die 610 may be cleared. In an embodiment, the backside protection layer 655 is disposed over the exposed backside surface 612 using any suitable deposition process. The backside protection layer 655 may be a polymer or other molding compound. The backside protection layer 655 may be disposed before or after removal of the second carrier 682.

Figure 7:
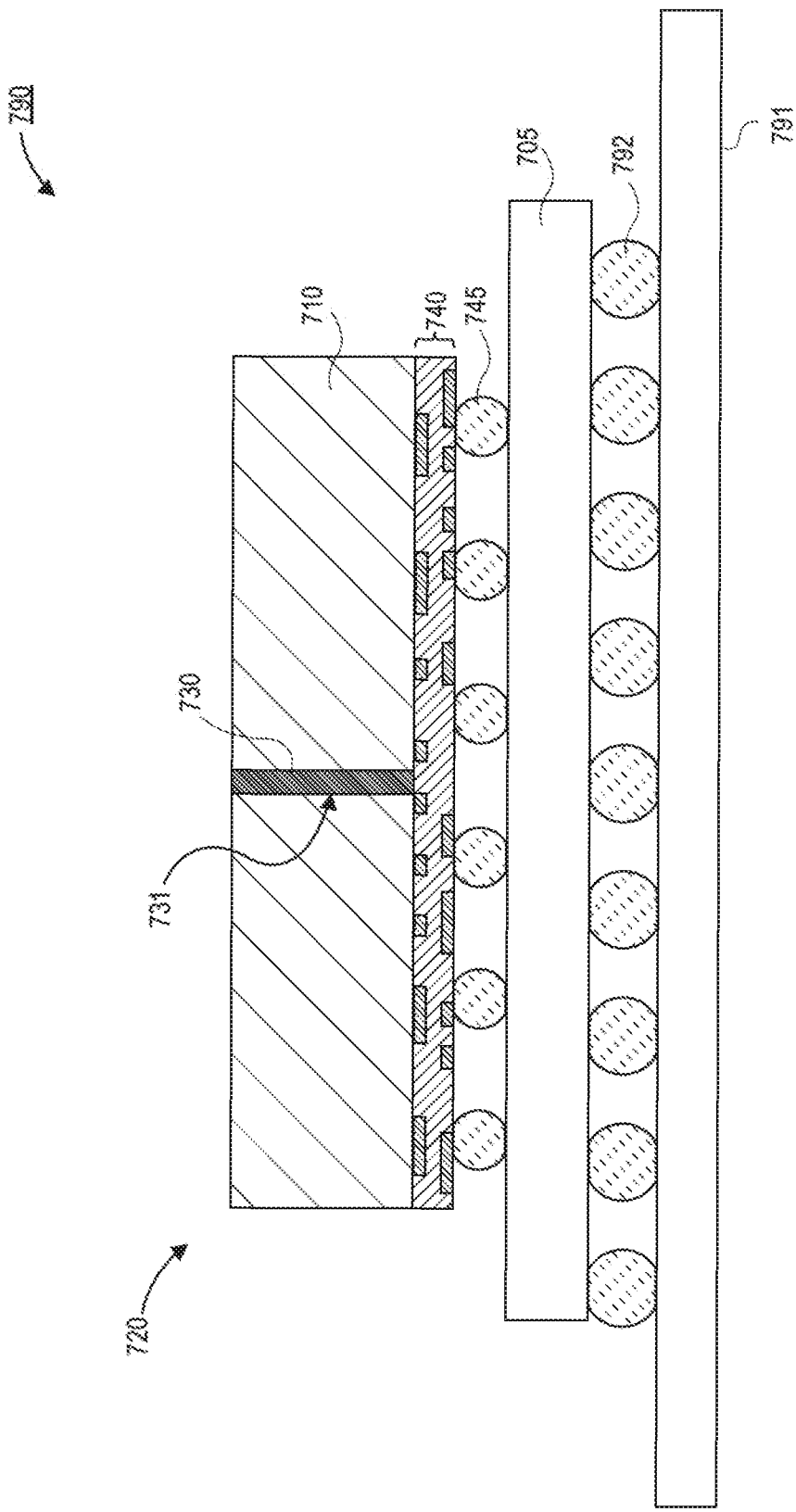
FIG. 7 is a cross-sectional illustration of an electronic system with a WLCSP that comprises a stress relief material, in accordance with an embodiment.

Referring now to FIG. 7, a cross-sectional illustration of an electronic system 790 is shown, in accordance with an embodiment. In an embodiment, the electronic system 790 may comprise a board 791 and a package substrate 705 attached to the board 791 by interconnects 792. Interconnects 792 are illustrated as solder balls, but it is to be appreciated that embodiments may include any suitable interconnect architecture. In an embodiment, a WLCSP 720 is attached to the package substrate 705 by interconnects 745.

In an embodiment, the WLCSP 720 may be similar to any of the WLCSPs described in greater detail above. For example, the WLCSP 720 illustrated in FIG. 7 is substantially similar to the WLCSP 120 described above with respect to FIG. 1A. For example, the WLCSP 720 comprises a die 710, an RDL 740 over the die 710, and a stress relief material 730 that is in a stress relief channel 731 that extends through a thickness of the die 710. In other embodiments, the stress relief channel 731 may extend partially through a thickness of the die 710. In yet another embodiment, there may be a plurality of stress relief channels 731, each filled with stress relief material 730.

Figure 8:
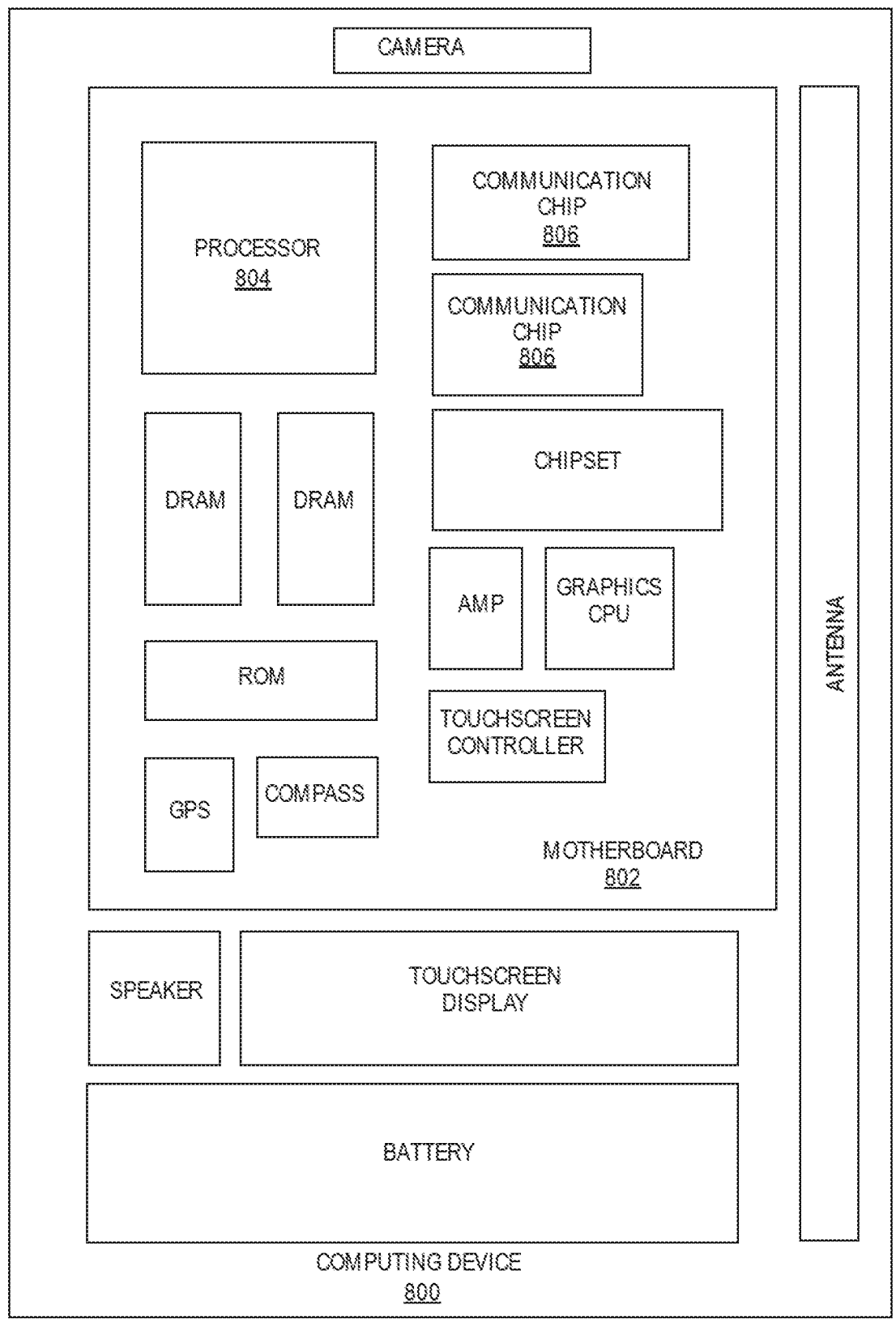
FIG. 8 is a schematic of a computing device built in accordance with an embodiment.

FIG. 8 illustrates a computing device 800 in accordance with one implementation of the invention. The computing device 800 houses a board 802. The board 802 may include a number of components, including but not limited to a processor 804 and at least one communication chip 806. The processor 804 is physically and electrically coupled to the board 802. In some implementations the at least one communication chip 806 is also physically and electrically coupled to the board 802. In further implementations, the communication chip 806 is part of the processor 804.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 806 enables wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 800 may include a plurality of communication chips 806. For instance, a first communication chip 806 may be dedicated to shorter range wireless communications such as Wi-Fi and Bluetooth and a second communication chip 806 may be dedicated to longer range wireless communications such as GPS, EDGE, GPRS, CDMA, WiMAX, LTE, Ev-DO, and others.

The processor 804 of the computing device 800 includes an integrated circuit die packaged within the processor 804. In some implementations of the invention, the integrated circuit die of the processor 804 may be a WLCSP with a stress relief channel that is filled by a stress relief material, in accordance with embodiments described herein. The term "processor" may refer to any device or portion of a device that processes electronic data from registers and/or memory to transform that electronic data into other electronic data that may be stored in registers and/or memory.

The communication chip 806 also includes an integrated circuit die packaged within the communication chip 806. In accordance with another implementation of the invention, the integrated circuit die of the communication chip 806 may be WLCSP with a stress relief channel that is filled by a stress relief material, in accordance with embodiments described herein.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: a wafer level chip scale package (WLCSP), comprising: a die, wherein the die comprises an active surface and a backside surface, and wherein the die has a first coefficient of thermal expansion (CTE); and a channel into the die, wherein the channel is filled with a stress relief material, wherein the stress relief material has a second CTE that is greater than the first CTE.

Example 2: the WLCSP of Example 1, wherein the channel extends from a first edge of the die to a second edge of the die.

Example 3: the WLCSP of Example 1 or Example 2, wherein the channel extends through an entire thickness between the active surface and the backside surface of the die.

Example 4: the WLCSP of Example 3, wherein the stress relief material is a conductive material.

Example 5: the WLCSP of Example 4, further comprising: a component over the backside surface of the die, wherein the component is electrically coupled to the active surface of the die by the stress relief material.

Example 6: the WLCSP of Example 5, wherein the component is a capacitor.

Example 7: the WLCSP of Examples 1-6, wherein the channel is disposed into the backside surface of the die.

Example 8: the WLCSP of Examples 1-6, wherein the channel is disposed into the active surface of the die.

Example 9: the WLCSP of Examples 1-7, further comprising: a plurality of channels into the die.

Example 10: the WLCSP of Example 9, wherein the plurality of channels comprises a first channel and a second channel.

Example 11: the WLCSP of Example 10, wherein the first channel is parallel to the second channel.

Example 12: the WLCSP of Example 10, wherein the first channel intersects the second channel.

Example 13: the WLCSP of Examples 10-12, wherein the first channel comprises a first stress relief material and the second channel comprises a second stress relief material that is different than the first stress relief material.

Example 14: the WLCSP of Examples 10-13, wherein the first channel is disposed into the active surface of the die, and wherein the second channel is disposed into the backside surface of the die.

Example 15: the WLCSP of Examples 1-13, further comprising: a mold layer over the backside surface and sidewalls of the die.

Example 16: a method of forming a wafer level chip scale package (WLCSP), comprising: providing a die with an active surface and a backside surface on a carrier, wherein the die has a first coefficient of thermal expansion (CTE); forming a channel into the die; filling the channel with a stress relief material, wherein the stress relief material has a second CTE that is larger than the first CTE; and forming a redistribution layer (RDL) over the active surface of the die.

Example 17: the method of Example 16, wherein the active surface faces away from the carrier.

Example 18: the method of Example 17, wherein the channel is formed into the active surface.

Example 19: the method of Example 17 or Example 18, wherein the RDL is disposed over the active surface before forming the channel.

Example 20: the method of Example 19, further comprising: transferring the die to a second carrier after the RDL is formed, wherein the active surface faces the second carrier, and wherein the channel is formed into the backside surface of the die.

Example 21: the method of Examples 16-20, wherein the active surface faces the carrier, and wherein the channel is formed into the backside surface of the die.

Example 22: the method of Example 21, further comprising: forming a mold layer over the die after filling the channel with the stress relief material, wherein the mold layer is over the backside surface and sidewalls of the die; and transferring the die to a second carrier before forming the RDL, wherein the active surface of the die faces away from the second carrier.

Example 23: an electronic system, comprising: a board; and a wafer level chip scale package (WLCSP) coupled to the board by interconnects, wherein the WLCSP comprises: a die; a redistribution layer over the die; and a stress relief channel disposed into a surface of the die.

Example 24: the electronic system of Example 23, wherein the stress relief channel passes through an entire thickness of the die.

Example 25: the electronic system of Example 23 or Example 24, further comprising: a component over a backside surface of the die, wherein the component is electrically coupled to an active surface of the die by the stress relief channel.

What is claimed is:

1. A wafer level chip scale package (WLCSP), comprising:
   a die comprising a semiconductor material, wherein the die comprises an active surface and a backside surface, and wherein the die has a first coefficient of thermal expansion (CTE); and
   a channel into the semiconductor material of the die but not to the active surface of the die, wherein the channel is filled with a stress relief material, wherein the stress relief material has an uppermost surface at or below a level of the backside surface of the die, and wherein the stress relief material has a second CTE that is greater than the first CTE.

2. The WLCSP of claim 1, wherein the channel extends from a first edge of the die to a second edge of the die.

3. The WLCSP of claim 1, wherein the stress relief material is a conductive material.

4. The WLCSP of claim 3, further comprising:
a component over the backside surface of the die.

5. The WLCSP of claim 4, wherein the component is a capacitor.

6. The WLCSP of claim 1, wherein the channel is disposed into the backside surface of the die.

7. The WLCSP of claim 1, further comprising:
a plurality of channels into the die.

8. The WLCSP of claim 7, wherein the plurality of channels comprises a first channel and a second channel.

9. The WLCSP of claim 8, wherein the first channel is parallel to the second channel.

10. The WLCSP of claim 8, wherein the first channel intersects the second channel.

11. The WLCSP of claim 8, wherein the first channel comprises a first stress relief material and the second channel comprises a second stress relief material that is different than the first stress relief material.

12. The WLCSP of claim 1, further comprising:
a mold layer over the backside surface and sidewalls of the die.

13. A method of forming a wafer level chip scale package (WLCSP), comprising:
providing a die comprising a semiconductor material, the die having an active surface and a backside surface on a carrier, wherein the die has a first coefficient of thermal expansion (CTE);
forming a channel into the semiconductor material of the die but not to the active surface of the die;
filling the channel with a stress relief material, wherein the stress relief material has an uppermost surface at or below a level of the backside surface of the die, and wherein the stress relief material has a second CTE that is larger than the first CTE; and
forming a redistribution layer (RDL) over the active surface of the die.

14. The method of claim 13, wherein the active surface faces away from the carrier.

15. The method of claim 14, wherein the RDL is disposed over the active surface before forming the channel.

16. The method of claim 15, further comprising:
transferring the die to a second carrier after the RDL is formed, wherein the active surface faces the second carrier, and wherein the channel is formed into the backside surface of the die.

17. The method of claim 13, wherein the active surface faces the carrier, and wherein the channel is formed into the backside surface of the die.

18. The method of claim 17, further comprising:
forming a mold layer over the die after filling the channel with the stress relief material, wherein the mold layer is over the backside surface and sidewalls of the die; and
transferring the die to a second carrier before forming the RDL, wherein the active surface of the die faces away from the second carrier.

19. An electronic system, comprising:
a board; and
a wafer level chip scale package (WLCSP) coupled to the board by interconnects, wherein the WLCSP comprises:
a die comprising a semiconductor material and an active surface;
a redistribution layer over the die; and
a stress relief channel disposed into the semiconductor material of the die but not to the active surface of the die.

20. The electronic system of claim 19, further comprising:
a component over a backside surface of the die.

21. A wafer level chip scale package (WLCSP), comprising:
a die, wherein the die comprises an active surface and a backside surface, and wherein the die has a first coefficient of thermal expansion (CTE); and
a first channel and a second channel into the die, wherein the first channel comprises a first stress relief material having a second CTE that is greater than the first CTE, and the second channel comprises a second stress relief material having a third CTE that is greater than the first CTE, the second stress relief material different than the first stress relief material.

22. A wafer level chip scale package (WLCSP), comprising:
a die comprising a semiconductor material, wherein the die comprises an active surface and a backside surface, and wherein the die has a first coefficient of thermal expansion (CTE); and
a first channel and a second channel into the semiconductor material of the die, wherein the first and second channels are filled with a stress relief material, wherein the first channel intersects the second channel.

23. A wafer level chip scale package (WLCSP), comprising:
a die comprising a semiconductor material, wherein the die comprises an active surface and a backside surface, and wherein the die has a first coefficient of thermal expansion (CTE); and
a channel into the semiconductor material of the die but not to the active surface of the die, wherein the channel extends from a first edge of the die to a second edge of the die, wherein the channel is filled with a stress relief material, and wherein the stress relief material has a second CTE that is greater than the first CTE.

24. A wafer level chip scale package (WLCSP), comprising:
a die comprising a semiconductor material, wherein the die comprises an active surface and a backside surface, and wherein the die has a first coefficient of thermal expansion (CTE);
a channel into the semiconductor material of the die but not to the active surface of the die, wherein the channel is filled with a stress relief material, wherein the stress relief material has a second CTE that is greater than the first CTE, and wherein the stress relief material is a conductive material; and
a component over the backside surface of the die, wherein the component is a capacitor.

25. A wafer level chip scale package (WLCSP), comprising:
a die comprising a semiconductor material, wherein the die comprises an active surface and a backside surface, and wherein the die has a first coefficient of thermal expansion (CTE);
a channel into the semiconductor material of the die but not to the active surface of the die, wherein the channel is filled with a stress relief material, wherein the stress relief material has a second CTE that is greater than the first CTE; and a mold layer over the backside surface and sidewalls of the die.

* * * * *